(12) United States Patent
Chen et al.

(10) Patent No.: US 9,007,749 B2
(45) Date of Patent: Apr. 14, 2015

(54) ELECTRONIC DEVICE ENCLOSURE

(75) Inventors: Yun-Lung Chen, New Taipei (TW); Gang Su, Wuhan (CN); Zhi-Qiang Li, Wuhan (CN); Zhi-Long Li, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 378 days.

(21) Appl. No.: 13/584,752

(22) Filed: Aug. 13, 2012

(65) Prior Publication Data

US 2014/0022713 A1  Jan. 23, 2014

(30) Foreign Application Priority Data

Jul. 23, 2012 (CN) .......................... 2012 1 2545742

(51) Int. Cl.
*H05K 5/00* (2006.01)
*H05K 7/00* (2006.01)
*H05K 5/02* (2006.01)

(52) U.S. Cl.
CPC ...................................... *H05K 5/023* (2013.01)

(58) Field of Classification Search
USPC ............... 361/679.01–679.09, 679.1–679.19, 361/679.21–679.29, 679.31–679.45, 361/679.55–679.6, 724–747; 248/917–924, 248/80–88, 155.1–155.5, 166–173, 248/180.1–186.2, 229.1–231.51, 271.4, 248/292.14, 316.1–316.8; 292/1–62, 113, 292/169.11–169.23, 341.11–341.19; 369/75.1, 75.2, 75.11, 75.21, 76, 369/77.11, 77.21, 78, 79, 80, 81, 82; 348/14.07, 51–52, 177, 348/333.01–333.13, 739

See application file for complete search history.

(56) References Cited

U.S. PATENT DOCUMENTS

| 4,652,030 A * | 3/1987 | Streett .......................... 292/336.3 |
| 2008/0036218 A1* | 2/2008 | Liang .......................... 292/336.3 |
| 2010/0244639 A1* | 9/2010 | Chen et al. .................. 312/223.2 |

* cited by examiner

*Primary Examiner* — Jerry Wu
(74) *Attorney, Agent, or Firm* — Novak Druce Connolly Bove + Quigg LLP

(57) ABSTRACT

An electronic device enclosure includes a top panel and a handling device. The top panel defines a mounting opening. The handling device includes a handling member, a cover member, and an elastic member. The handling member is mounted to the top panel. The handling member defines a receiving opening corresponding to the mounting opening. The cover member is pivotally mounted to the handling member and is received in the receiving opening. The elastic member elastically resists an inner side of the cover member. The cover member is received in the receiving opening in a first position. The elastic member elastically resists an inner side of the cover member in the first position. The cover member is configured to rotate inward to move from the first position to a second position. The elastic member is deformed when the cover member is in the second position.

19 Claims, 4 Drawing Sheets

ELECTRONIC DEVICE ENCLOSURE

BACKGROUND

1. Technical Field

The present disclosure relates to electronic device enclosures, more particularly to an electronic device enclosure with a handle.

2. Description of Related Art

An enclosure of an electronic device often includes a top plate, a bottom plate opposite to the top plate, and a front plate. An operating portion extends from the top plate and protrudes from the front plate for moving the electronic device. A user can use one hand on the operating portion, and the other hand on the bottom plate, to move the electronic device. However, this method is inconvenient. Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
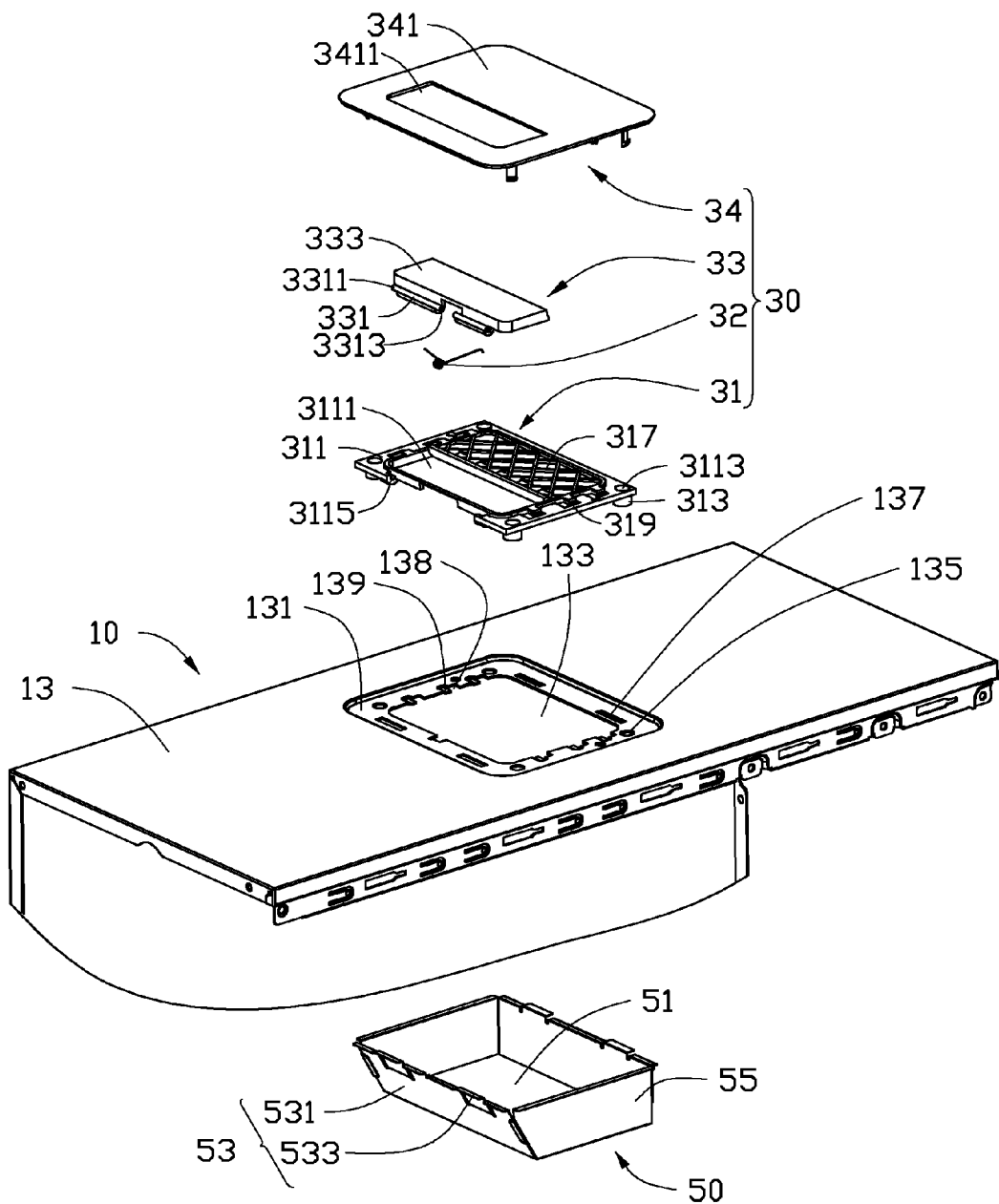
FIG. 1 is an exploded, isometric view of an electronic device enclosure in accordance with an embodiment.
Figure 2:
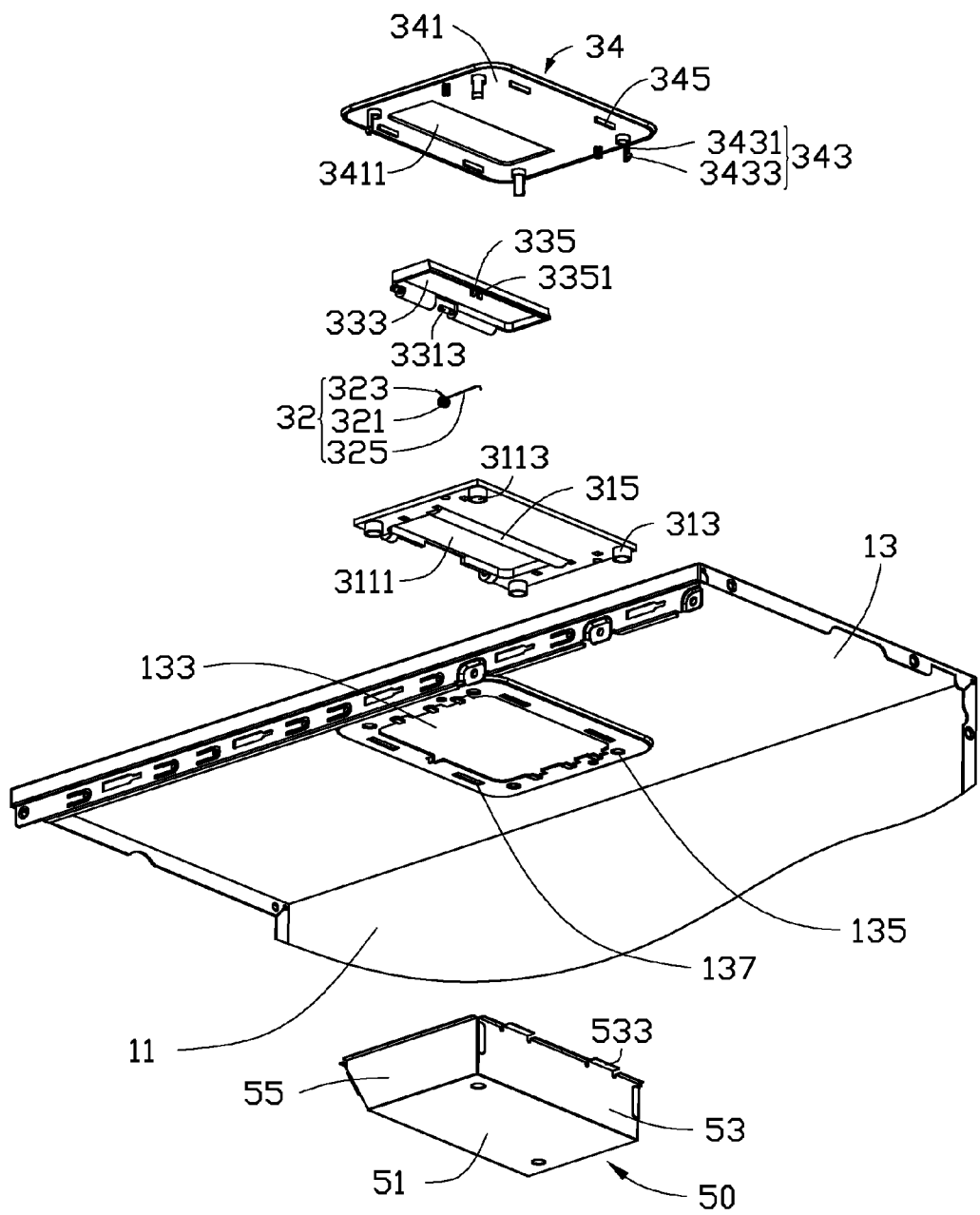
FIG. 2 is similar to FIG. 1, but viewed from another aspect.

Referring to FIGS. 1 and 2, an electronic device enclosure in accordance with an embodiment is shown. The electronic device includes an enclosure body 10, a handling device 30, and a cover 50 for electro magnetic interference (EMI) insolation.

The enclosure body 10 includes a side panel 11 and a top panel 13 extending from the side panel 11. The top panel 13 is substantially perpendicular to the side panel 11. The top panel 13 defines a recess portion 131. The recess portion 131 defines a mounting opening 133. The recess portion 131 further defines four mounting holes 135 and four positioning holes 137. The recess portion 131 further defines four cutouts 138 communicating with the mounting opening 133. The recess portion 131 includes four support portions 139 each corresponding to the cutout 138.

The handling device 30 includes a handling member 31, an elastic member 32, a cover member 33, and a securing member 34. The handling member 31 includes a handling member body 311, four engaging protrusions 313, a handling portion 315, and ribs 317. The ribs 317 extend upwards from the handling member body 311 and the engaging protrusions 313, and the handling portion 315 extends downward from the handling member body 311. The handling member body 311 defines a receiving opening 3111. The handling portion 315 is located on a side of the receiving opening 3111. The cross section of the handling portion 315, taken along a plane perpendicular to the handling member body 311, is arc-shaped. The handling member body 311 defines four through holes 3113 extending through the engaging protrusions 313. The four through holes 3113 corresponds to the mounting holes 135. The handling member 31 further includes a plurality of mounting tabs 319 extending upward from the handling member body 311. Each mounting tab 319 is L-shaped. Each mounting tab 319 is used for being placed on the supporting portion 139 via the cutout 138. The handling member body 311 further defines two recess slots 3115.

The elastic member 32 includes a surrounding portion 321, a first elastic arm 323 extending from the surrounding portion 321, and a second elastic arm 325 extending from the surrounding portion 321.

The cover member 33 includes a pivot portion 331 and a panel body 333, extending from the pivot portion 331. The panel body 333 corresponds to the receiving opening 3111. The pivot portion 331 includes two pivot protrusions 3311, corresponding to the two recess slots 3115, and a mounting protrusion 3313, located between the two pivot protrusions 3311. The mounting protrusion 3313 corresponds to the surrounding portion 321 of the elastic member 32. The cover member 33 further includes a positioning portion 335 extending from an inner side of the panel body 333. The positioning portion 335 defines a notch 3351. The notch 3351 is used for receiving the second elastic arm 325 of the elastic member 32.

The securing member 34 includes a cover body 341, four securing portions 343 extending from an inner side of the cover body 341, and four positioning protrusions 345 extending from the inner side of the cover body 341. The securing portions 343 include a connecting arm 3431 extending from the cover body 341 and an engaging portion 3433 extending from the connecting arm 3431. The cover body 341 defines an accommodating opening 3411 corresponding to the panel body 333 of the cover member 33.

The cover 50 includes a bottom wall 51, two first side walls 53 extending from the bottom wall 51, and two second side walls 55 extending from the bottom wall 51. A receiving space 57 is surrounded by the bottom wall 51, the two first walls 53, and the two second walls 55. Each first wall 53 includes a side wall body 531 and two securing tabs 533 extending outward from the side wall body 531. The securing tabs 533 are used for engaging with the edges of the positioning holes 137.

Figure 3:
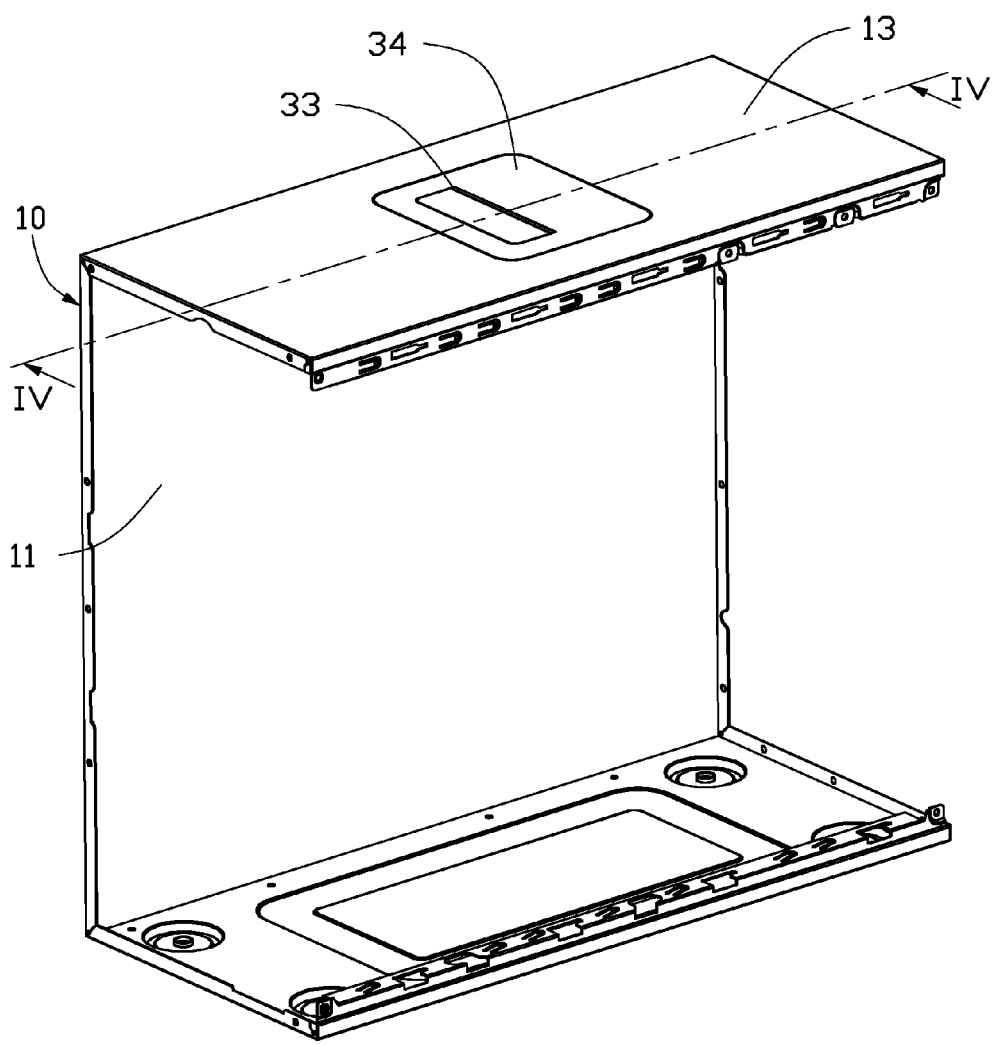
FIG. 3 is an assembled view of FIG. 1.

Referring to FIGS. 1 to 3, in assembly, the surrounding portion 321 of the elastic member 32 is coiled around the mounting protrusion 3313 of the cover member 33. The second elastic arm 325 is placed in the notch 3351 of the cover member 33. The pivot protrusions 3311 of the cover member 33 are placed in the recess slots 3115 of the handling member 31. The cover member 33 is rotated to enable the panel body 333 of the cover member 33 to be received in the receiving opening 3111. The mounting tabs 319 of the handling member 31 are extended through the cutouts 138 and move to be placed on the support portions 139. The first elastic arm 323 of the elastic member 32 is placed on the inner side of the top panel 13. At this time, the through holes 3113 of the handling member 31 are aligned with the mounting holes 135. The two first side walls 53 are pressed inward to enable the securing tabs 533 to pass through the positioning holes 137 of the top panel. The securing tabs 533 engage with the edges of the positioning holes 137 when the two first side walls 53 are in the free status. The securing portions 343 of the securing member 34 are aligned with the mounting holes 135 and the through holes 3113. At this time, the positioning protrusions 345 are aligned with the positioning holes 137. The accommodating opening 3411 corresponds to the panel body 333. The securing member 34 moves towards the top panel 13 to enable the securing portions 343 to pass through the mounting holes 135 and the through holes 3113. The engaging portions 3433 of the securing portions 343 engage with the engaging protrusions 313.

Figure 4:
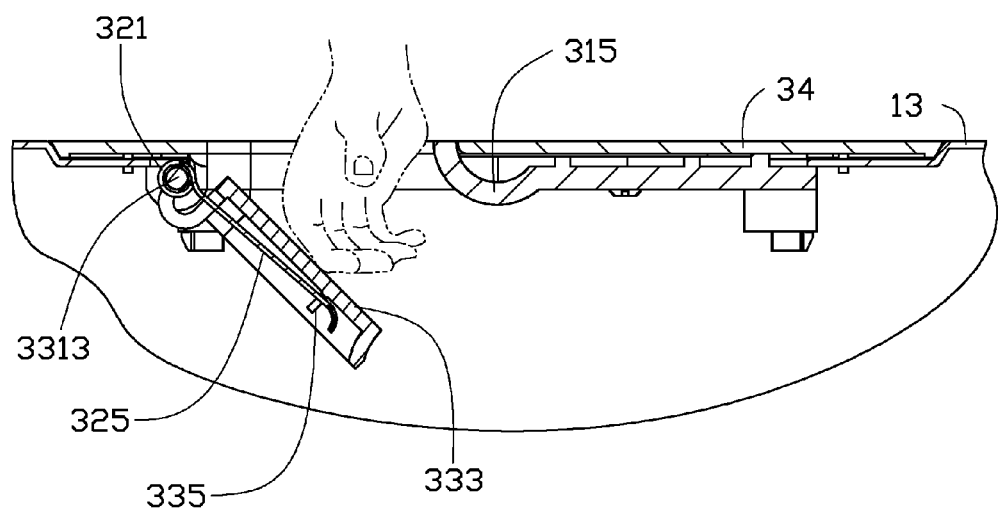
FIG. 4 is a cross-section view of FIG. 3 taken along a line IV-IV.

Referring to FIG. 4, in use, the panel body 333 of the cover member 33 are pressed by a hand to rotate inward. At this time, the panel body 333 resists the second elastic arm 325 to enable the second elastic arm 325 to be deformed. Then the hand can hold the handling portion 315 of the handling member 31 to lift up the electronic device enclosure. When the hand removes, the second elastic arm 325 releases to drive the cover member 33 to rotate outward, thereby enabling the cover member 33 to be received in the receiving opening 3111.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure comprising: a top panel, the top panel defines a mounting opening; and a handling device, the handling device comprises: a handling member mounted to the top panel, the handling member defines a receiving opening corresponding to the mounting opening; a cover member pivotally mounted to the handling member; and an elastic member; wherein the cover member is received in the receiving opening in a first position; the elastic member elastically resists an inner side of the cover member in the first position; and a securing member covers the handling member and defines an accommodating opening to receive a panel body of the cover member; when the panel body is pressed by a hand, the cover member is configured to rotate inward to move from the first position to a second position; and the elastic member is deformed when the cover member is in the second position; therefore the hand can hold the handling member to lift up the electronic device.

2. The electronic device enclosure of claim 1, wherein the cover member comprises a pivot portion pivotally mounted to the handling member and the panel body extending from the pivot portion, and the panel body is received in the receiving opening.

3. The electronic device enclosure of claim 2, wherein the cover member further comprises a positioning portion extending inward from the panel body; the positioning portion defines a notch; the elastic member comprises an elastic arm resisting the inner side of the cover member; and the elastic arm is located in the notch.

4. The electronic device enclosure of claim 2, wherein the pivot portion comprises two pivot protrusions, and the cover member defines two recess slots receiving the two pivot protrusions.

5. The electronic device enclosure of claim 2, wherein the handling member comprises a handling member body and a handling portion extending inward from the handling member body; the receiving opening is defined in the handling member body; and the handling portion is located beside the receiving opening.

6. The electronic device enclosure of claim 5, wherein the handling member further comprises a mounting tab extending from the handling member body; the mounting tab is L-shaped; the top panel defines a cutout communicating with the mounting opening; the top panel further comprises a support portion corresponding to the cutout; and the mounting tab is configured to pass through the cutout to be placed on the support portion.

7. The electronic device enclosure of claim 1, wherein the elastic member comprises a surrounding portion, a first elastic arm extending from the surrounding portion, and a second elastic arm extending from the surrounding portion; the first elastic arm abuts the top panel; the second elastic arm abuts the inner side of the cover member; the cover member comprises a mounting protrusion; and the surrounding portion is coiled around the mounting protrusion.

8. The electronic device enclosure of claim 1, further comprising the securing member, wherein the securing member comprises a cover body and a plurality of securing portions extending from the cover body; the top panel comprises a recess portion; the mounting opening is defined in the recess portion; the recess portion defines a plurality of mounting holes corresponding to the plurality of securing portions; the handling member defines a plurality of through holes; the plurality of securing portions are engaged in the plurality of mounting holes and the plurality of the through holes; and the cover body is received in the recess portion.

9. The electronic device enclosure of claim 8, wherein the securing member further comprises a plurality of positioning protrusions, and the recess portion defines a plurality of positioning holes receiving the plurality of positioning protrusions.

10. The electronic device enclosure of claim 8, further comprising a cover, wherein the cover is mounted to an inner surface of the top panel and corresponds to the mounting opening.

11. An electronic device enclosure comprising: a top panel, the top panel defines a mounting opening; and a handling device, the handling device comprising: a handling member mounted to an inner surface of the top panel, the handling member defines a receiving opening corresponding to the mounting opening; a cover member pivotally mounted on the inner surface and received in the receiving opening; and an elastic member, the elastic member is mounted on the inner surface and elastically resists an inner side of the cover member; wherein the cover member is configured to rotate inward to expose the receiving opening, and the elastic member is configured to resist the cover member to rotate outward to cover the receiving opening; and a securing member, wherein the securing member comprises a cover body and a plurality of securing portions extending from the cover body; the top panel comprises a recess portion; the mounting opening is defined in the recess portion; the recess portion defines a plurality of mounting holes corresponding to the plurality of securing portions; the handling member defines a plurality of through holes; the plurality of securing portions are engaged in the plurality of mounting holes and the plurality of the through holes; and the cover body is received in the recess portion.

12. The electronic device enclosure of claim 1, wherein the cover member comprises a pivot portion pivotally mounted to the handling member and a panel body extending from the pivot portion, and the panel body is received in the receiving opening.

13. The electronic device enclosure of claim 12, wherein the cover member further comprises a positioning portion extending inward from the panel body; the positioning portion defines a notch; the elastic member comprises an elastic arm resisting the inner side of the cover member; and the elastic arm is placed in the notch.

14. The electronic device enclosure of claim 12, wherein the pivot portion comprises two pivot protrusions, and the cover member defines two recess slots receiving the two pivot protrusions.

15. The electronic device enclosure of claim 12, wherein the handling member comprises a handling member body and a handling portion extending inward from the handling member body; the receiving opening is defined in the handling member body; and the handling portion is located beside the receiving opening.

16. The electronic device enclosure of claim 15, wherein the handling member further comprises a mounting tab extending from the handling member body; the mounting tab is L-shaped; the top panel defines a cutout communicating with the mounting opening; the top panel further comprises a support portion corresponding to the cutout; and the mounting tab is configured to pass through the cutout to be placed on the support portion.

17. The electronic device enclosure of claim 11, wherein the elastic member comprises a surrounding portion, a first elastic arm extending from the surrounding portion, and a second elastic arm extending from the surrounding portion; the first elastic arm abuts the top panel; the second elastic arm abuts the inner side of the cover member; the cover member comprises a mounting protrusion; and the surrounding portion is coiled around the mounting protrusion.

18. The electronic device enclosure of claim 11, wherein the securing member further comprises a plurality of positioning protrusions, and the recess portion defines a plurality of positioning holes receiving the plurality of positioning protrusions.

19. The electronic device enclosure of claim 11, further comprising a cover, wherein the cover is mounted to an inner side of the top panel and corresponds to the mounting opening.

* * * * *